United States Patent [19]

Theodore et al.

[11] Patent Number: 5,565,690

[45] Date of Patent: Oct. 15, 1996

[54] METHOD FOR DOPING STRAINED HETEROJUNCTION SEMICONDUCTOR DEVICES AND STRUCTURE

[75] Inventors: N. David Theodore, Mesa, Ariz.; Donald Y. C. Lie, Pasadena, Calif.; T. C. Smith, Scottsdale, Ariz.; John W. Steele, Chandler, Ariz.

[73] Assignee: Motorola, Inc., Schaumburg, Ill.

[21] Appl. No.: 382,699

[22] Filed: Feb. 2, 1995

[51] Int. Cl.[6] .......................... H01L 29/06; H01L 21/265
[52] U.S. Cl. .............................. 257/18; 257/19; 257/187; 257/197; 257/51; 257/65; 257/565; 437/20; 437/22; 437/31; 437/966; 437/976
[58] Field of Search .................................. 257/18, 19, 51, 257/65, 187, 197, 565; 437/20, 22, 31, 966, 976

[56] References Cited

U.S. PATENT DOCUMENTS

| | | |
|---|---|---|
| 4,818,721 | 4/1989 | Wang . |
| 4,956,698 | 9/1990 | Wang . |
| 5,087,576 | 2/1992 | Edmond et al. . |
| 5,212,101 | 5/1993 | Canham et al. . |
| 5,357,119 | 10/1994 | Wang et al. ......................... 257/18 |

OTHER PUBLICATIONS

Lie et al., Steady–State Versus Rapid Thermal Annealing of Phosphorus–Implanted Pseudomorphic Si(100)/$Ge_{0.12}Si_{0.88}$, Apr. 1994, SRC Pub C94167, pp. 1–6.

*Primary Examiner*—Edward Wojciechowicz
*Attorney, Agent, or Firm*—Kevin B. Jackson

[57] ABSTRACT

A method for doping a strained heterojunction semiconductor device includes heating a substrate (16) having a strained mono-crystalline semiconductor region (22) to a temperature above room temperature. While the substrate (16) is heated, dopants are ion implanted into the strained mono-crystalline semiconductor region (22) to minimize implant related damage. Thereafter the substrate (16) is heated under non-steady state conditions for a time sufficient to activate the implanted dopant and anneal implant related damage while minimizing relaxation of the strained heterojunction.

20 Claims, 3 Drawing Sheets

METHOD FOR DOPING STRAINED HETEROJUNCTION SEMICONDUCTOR DEVICES AND STRUCTURE

BACKGROUND OF THE INVENTION

The present invention relates, in general, to semiconductor processing, and in particular, to methods for doping strained heterojunction semiconductor devices.

Strained heterojunction semiconductor structures including silicon/silicon-germanium (Si/Si$_{1-x}$Ge$_x$) devices have been reported. These structures are used to form devices such as heterojunction bipolar transistor (HBT) devices or enhanced mobility metal-oxide semiconductor field effect transistor (MOSFET) devices. Strained heterojunction semiconductor structures are very attractive for high performance electronic devices and circuits because they provide a silicon-based technology with enhanced carrier mobility compared to pure silicon. Also, silicon-based strained heterojunction devices are more cost effective than III-V based heterojunction devices making them more preferable in certain applications.

When ion implantation is used in the fabrication of strained heterojunction devices, high concentrations of implantation-induced point defects and point defect clusters are known to substantially enhance the relaxation of the strained semiconductor lattice. This relaxation destroys, among other things, the enhanced carrier mobility effect. Also, ion implantation related damage can lead to the formation of dislocation and dislocation loop defects in subsequent high temperature processes. These defects can detrimentally affect the electrical characteristics of the strained heterojunction device, which in turn affects device manufacturing yield and reliability. In addition, unless the process used to activate the implanted dopants is done under appropriate conditions, it is difficult to both activate the implanted dopants and anneal the implant related damage while at the same time maintaining the strained heterojunction in a strained condition.

As is readily apparent, a need exists for a method of doping strained heterojunction devices with ion implantation that reduces implant related damage, that results in a device having good electrical characteristics, that effectively activates the implant dopants, and that minimizes relaxation of the strained heterojunction.

DETAILED DESCRIPTION OF THE DRAWINGS

In general, the present invention relates to methods for doping strained heterojunction semiconductor structures. To avoid relaxing the strained heterojunction and generating defects during and as a result of dopant incorporation, a strained heterojunction device is doped using ion implantation while the strained heterojunction device is sustained at a temperature above room temperature. The dopant is subsequently activated under non-steady state conditions at an elevated temperature for a time sufficient to activate the dopant and anneal implant related damage while maintaining the heterojunction in a strained condition. The method is suitable for doping IV-IV strained heterojunction semiconductor devices including germanium doped silicon devices, germanium/carbon doped silicon devices, carbon doped silicon devices, and the like. In addition, the method is suitable for strained III-V and II-VI heterojunction semiconductor structures formed using ion implantation doping techniques.

More particularly, the elevated temperature at which the strained heterojunction device is sustained during ion implantation depends upon the conditions of the implant. Such conditions include the incident power in the ion beam, the implant dose, and the ion beam current (and therefore the implanting time). The strained heterojunction device is heated or exposed to the elevated temperature using, for example, radiative or conductive heat transfer techniques. After implantation, the implanted dopant is activated using rapid thermal anneal (RTA) techniques to achieve sufficient dopant activation and implant related damage reduction while minimizing relaxation of the strained heterojunction.

The present invention can be more fully described with reference to FIGS. 1–6 together with the following detailed description. By way of example only, the present invention is described in the fabrication of a IV-IV NPN strained heterojunction bipolar device. It is understood that the present invention is suitable for PNP heterojunction bipolar devices, enhanced mobility MOSFET devices, and other devices employing strained heterojunction structures that require doping.

Figure 1:
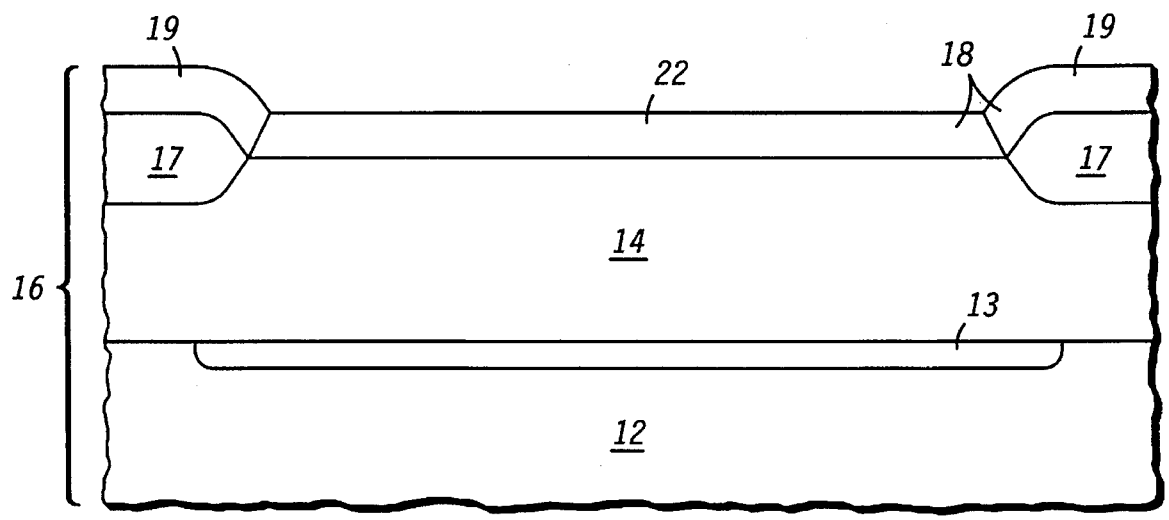
FIGS. 1–3 illustrate cross-sectional views of a strained heterojunction device at various stages of manufacture according to the present invention.

FIG. 1 illustrates an enlarged cross-sectional view of a strained heterojunction structure or device 11 formed within a semiconductor substrate or substrate 16 at an early stage of manufacture. Substrate 16 includes starting or support substrate or layer 12, buried layer 13, epitaxial or doped layer 14, passivation or isolation regions 17, and strained layer 18 (as is explained below, strained layer 18 includes polycrystalline semiconductor regions 19 and strained mono-crystalline semiconductor region 22). In a IV-IV strained heterojunction structure, strained layer 18 comprises a semiconductor alloy layer. For a III-V or a II-VI strained heterojunction structure, strained layer 18 comprises a compound semiconductor layer.

In this example, support substrate 12 comprises p-type conductivity silicon that is doped with boron to concentration in a range from $7.0 \times 10^{14}$ to $2.0 \times 10^{15}$ atoms/cm$^3$. Buried layer 13 comprises an n-type conductivity region and is doped with an n-type dopant such as phosphorous, arsenic, or antimony. Preferably, buried layer 13 is doped with arsenic or antimony having a peak concentration on the order of 1.0 to $5.0 \times 10^{19}$ atoms/cm$^3$. Buried layer 13 is formed within support substrate 12 using well known photolithographic and doping techniques.

Doped layer 14 preferably comprises an n-type silicon layer doped with an n-type dopant such as phosphorous or arsenic. Preferably, doped layer 14 has a thickness on the order of 1.5 microns and a dopant concentration in a range from $1.0 \times 10^{16}$ to $3.0 \times 10^{16}$ atoms/cm$^3$. It is understood that the thickness and dopant concentration of doped layer 14 is determined by the desired electrical characteristics of the finished device. The parameters given above are suitable for a bipolar device having a base/collector breakdown voltage in a range of approximately 3 to 80 volts. Doped layer 14 preferably is formed using well known epitaxial growth techniques. Doped layer 14 is doped either during the epitaxial growth process or is subsequently doped using ion implantation or deposition techniques.

Isolation regions 17 preferably comprise silicon oxide, have a thickness on the order of 0.65 microns, and are formed using well known processing techniques. When isolation regions 17 comprise silicon oxide, isolation regions 17 are typically referred to as field oxide regions. Optionally, isolation regions 17 comprise etched trenches filled with a passivation material such as silicon oxide or the like. Techniques for forming isolation trenches are well known in the art.

Strained layer 18 includes polycrystalline semiconductor regions 19 and strained mono-crystalline semiconductor region or layer 22. For a IV-IV strained heterojunction structure, strained mono-crystalline semiconductor region 22 comprises a IV-IV mono-crystalline semiconductor alloy layer. For a III-V or a II-VI strained heterojunction structure, strained mono-crystalline semiconductor region 22 comprises a III-V or a II-VI mono-crystalline compound semiconductor.

In the present example, strained mono-crystalline semiconductor region 22 comprises a IV-IV semiconductor alloy material. Preferably, strained mono-crystalline semiconductor region 22 comprises a germanium-doped silicon ($Si_{1-x}Ge_x$, with X preferably in a range from 0.01 to 0.50) layer. Preferably, strained mono-crystalline semiconductor region 22 comprises a p-type $Si_{1-x}Ge_x$ layer doped with boron in a range from $1.0 \times 10^{18}$ to $5.0 \times 10^{19}$ atoms/cm$^3$. The boron is either uniform throughout strained mono-crystalline semiconductor region 22 or localized in a upper region of strained mono-crystalline semiconductor region 22 with the majority of germanium concentration localized in a region of strained mono-crystalline semiconductor region 22 below the upper region. In the present example, strained mono-crystalline semiconductor region 22 has a thickness in a range from 0.25 to 0.35 microns.

Preferably, strained layer 18 is formed using well known epitaxial growth techniques. During the epitaxial growth of strained layer 18, polycrystalline semiconductor regions 19 form over isolation regions 17 and strained mono-crystalline semiconductor region 22 forms over an exposed portion of doped layer 14. The concentration of germanium in strained layer 18 and the growth conditions of strained layer 18 are such that strained mono-crystalline semiconductor region 22 forms a strained heterojunction with doped layer 14. In the present example, doped layer 14 forms a collector region and strained mono-crystalline semiconductor region 22 forms a base region of the device.

Figure 2:
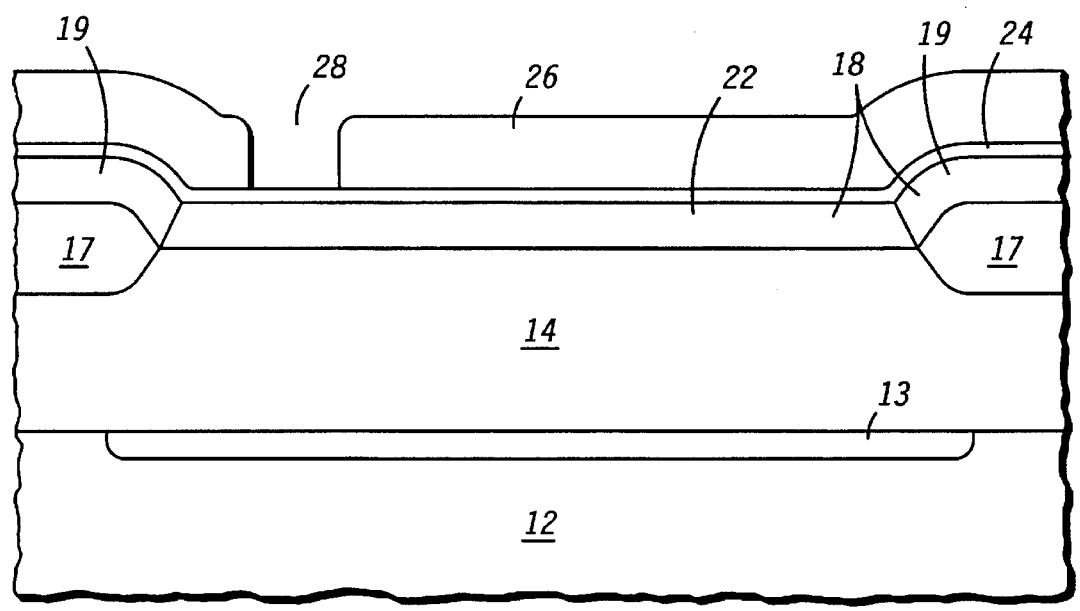

FIG. 2 illustrates strained heterojunction device 11 at a later step of manufacture after screen oxide layer 24 and protective layer or implant masking layer 26 have been formed over strained layer 18. Screen oxide layer 24 has a thickness in a range from approximately 0.05 to 0.12 microns and is formed using well known process techniques. Preferably, screen oxide layer 24 is formed using wet oxidation or dry oxidation techniques. Protective layer 26 comprises an organic, dielectric, or inorganic material. Preferably, protective layer 26 comprises a photoresist and is deposited, exposed, and developed using conventional photolithographic techniques. Protective layer 26 is shown with an opening 28 to allow for the subsequent selective incorporation of dopants into strained mono-crystalline semiconductor region 22 and doped layer 14.

Figure 3:
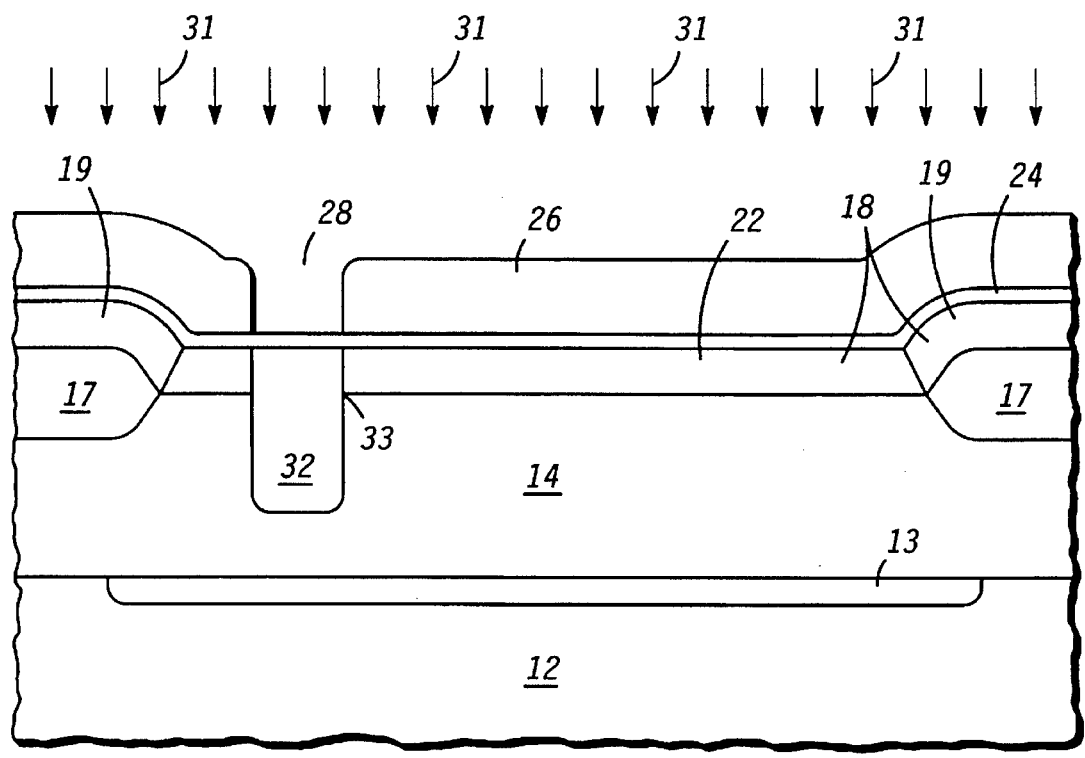

FIG. 3 shows the incorporation or introduction of a dopant or dopants into strained mono-crystalline semiconductor region 22 and doped layer 14. In the present example, substrate 16 is placed into an ion implanter and an n-type dopant is ion implanted, represented by arrows 31, through opening 28 into strained heterojunction device 11 to form doped region or ion implanted region 32. In this example, ion implanted region 32 forms an ion implanted collector contact region. Preferably, ion implanted region 32 is formed using phosphorous implantation with an implant dosage in a range from approximately $8.0 \times 10^{13}$ to $2.0 \times 10^{14}$ ions/cm$^2$ and with an implant energy on the order of 180 kilo electron volts (keV).

When ion implantation is used to dope strained heterojunction structures, ion implantation related damage can result in the formation of defects during subsequent processing. These defects, including point defects, point defect clusters, dislocations, and dislocation loops, have been found to enhance the relaxation of the strained heterojunction. This relaxation eliminates or reduces the enhanced electrical parameters found in strained heterojunction structures (e.g. enhanced carrier mobility). Also, these defects increase leakage current, particularly at the interface or junction 33 between strained mono-crystalline semiconductor region 22 and ion implanted region 32/doped layer 14.

In order to reduce or minimize implantation damage effects, substrate 16 is heated or exposed to a temperature above room temperature (above approximately 25° C.) according to the present invention during ion implantation. Preferably, substrate 16 is heated to a temperature in a range from approximately 40° to 250° C. The temperature selected depends upon, among other things, the selected implant dose as illustrated in FIG. 4.

Figure 4:
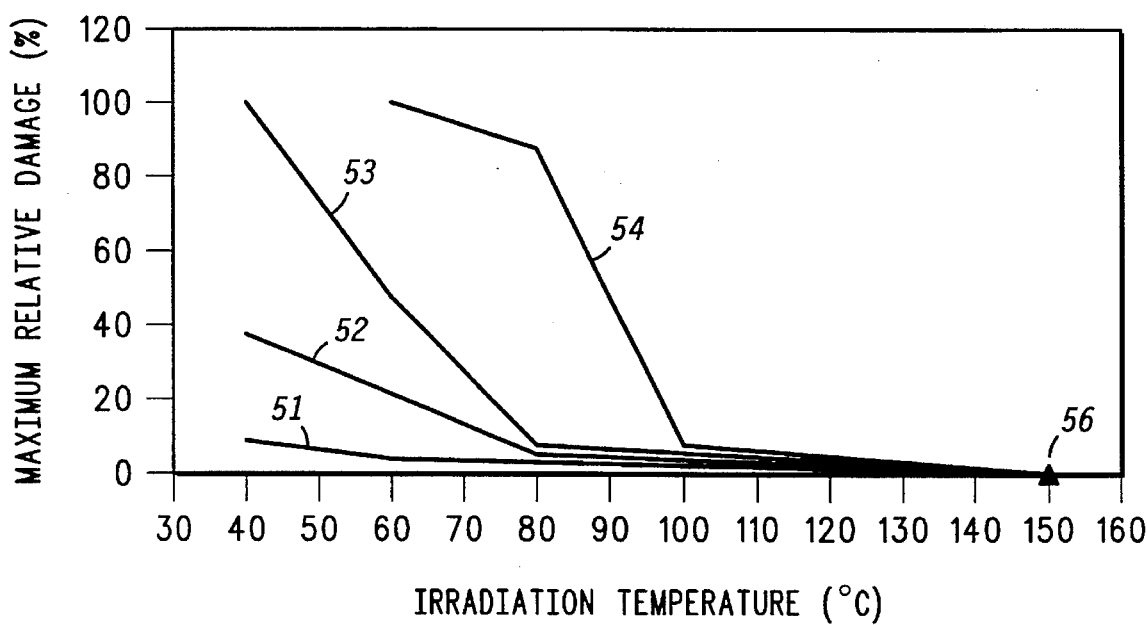
FIG. 4 is a graph showing the effect of substrate temperature on implant damage according to the stage of manufacture shown in FIG. 3.

FIG. 4 is a graph showing the relationship between the maximum relative damage (in percentage) and temperature (in degrees Celsius) of a substrate during ion implantation. To produce FIG. 4, substrates comprising <100> silicon wafers having an epitaxial layer of strained $Si_{0.90}Ge_{0.10}$ formed on one surface are implanted or irradiated with silicon ($^{28}Si^+$) at temperatures ranging from 40° to 150° C. and doses ranging from $1.0 \times 10^{14}$ to $30.0 \times 10^{14}$ ions/cm$^2$. An energy of 320 KeV is suitable. Curve 51 represents a dose of $1.0 \times 10^{14}$ ions/cm$^2$, curve 52 represents a dose of $3.0 \times 10^{14}$ ions/cm$^2$, curve 53 represents a dose of $5.0 \times 10^{14}$ ions/cm$^2$, and curve 54 represents a dose of $10.0 \times 10^{14}$ ions/cm$^2$. Data point 56 (shown as a triangle) represents a dose of $30.0 \times 10^{14}$ ions/cm$^2$.

Maximum relative damage is obtained using, for example, Rutherford Back-Scattering (RBS)/ion channeling techniques. As is readily apparent from this data, as the implant dose increases, the temperature used during the implantation of dopants into substrate 16 must be increased in order to decrease any damage that remains after implantation. This data, which is based on silicon implants, correlates well to phosphorous implants because of, among other things, the similar atomic weights between silicon and phosphorous.

Preferably, for phosphorous doping, and for implant doses in a range from approximately $1.0 \times 10^{14}$ to $3.0 \times 10^{14}$ ions/cm$^2$, substrate temperature is in a range from approximately 40° to 60° C. For phosphorous implant doses in a range from approximately $3.0 \times 10^{14}$ to $5.0 \times 10^{14}$ ions/cm$^2$, substrate temperature is in a range from approximately 60° to 80° C. For phosphorous implant doses in a range from approximately $5.0 \times 10^{14}$ to $10.0 \times 10^{14}$ ions/cm$^2$ substrate temperature is in a range from approximately 80° to 100° C. For phosphorous implants doses in a range from approximately $10.0 \times 10^{14}$ to $30.0 \times 10^{14}$ ions/cm$^2$ substrate temperature is in a range from approximately 100° to 150° C. For phosphorous doses in excess of $30.0 \times 10^{14}$ ions/cm$^2$, a substrate temperature on the order of 150° to 300° C. is preferred. Preferably, the temperature of substrate 16 does not exceed 250° to 300° C. to avoid damaging or degrading protective layer 26 when protective layer 26 comprises an organic such as a photoresist. When temperatures above approximately 250° to 300° C. are used for heavier dose implants, protective layer 26 comprises a material capable of withstanding such temperatures. Examples of such protective layers include oxide layers and/or nitride layers.

Similar temperature ranges or lower temperature ranges are used for boron implants as set out above. Lower temperatures during implantation are an option for boron because of, among other things, boron's lower atomic weight compared to silicon. For arsenic implants, the temperature during implantation is higher than the temperature for phosphorous.

Several well known techniques can be used to heat substrate 16 during ion implantation. Such techniques include resistive heating techniques. For example, heater wires are embedded into a wafer holder apparatus compatible with ion implantation equipment. Substrate 16 is placed into the wafer holder apparatus and a voltage is applied to the heater wires to provide the desired temperature. Optionally, the substrate is heated to one temperature and the scanned incident ion beam is used to further heat substrate 16. Other techniques for heating substrate 16 include heat lamps placed in proximity to the front of substrate 16, or a heated gas flowing in proximity to substrate 16.

Figure 5:
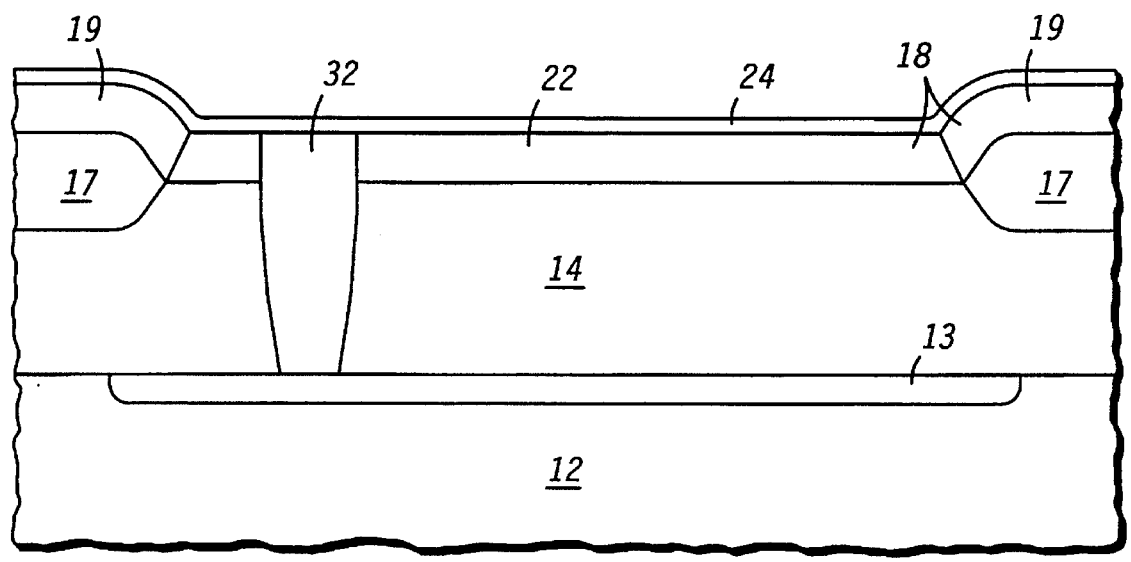
FIGS. 5–6 illustrate cross-sectional views of the strained heterojunction device of FIGS. 1–3 at later stages of manufacture according to the present invention.

Referring now back to FIG. 3, ion implanted region 32 preferably is implanted while substrate 16 is maintained at or exposed to a temperature in a range from approximately 60° to 100° C. After implantation, protective layer 26 is removed and substrate 16 is then annealed at or heated to an elevated temperature to both activate the implanted dopant and anneal implant damage. During the heating process, ion implanted region 32 diffuses deeper into doped layer 14 and approaches buried layer 13. Preferably, ion implanted region 32 is formed using an implant energy and activated using a heating time sufficient to place a portion of ion implanted region 32 into buried layer 13 as shown in FIG. 5.

Preferably, substrate 16 is heated under conditions that activate the implanted dopant, that remove any damage induced by ion implantation, and that preserve the strained heterojunction characteristics of strained heterojunction device 11. Experimentation and analytical techniques including RBS, x-ray diffraction, and transmission electron microscopy (TEM) show that a non-steady state or rapid thermal anneal (RTA) process is preferred over a steady-state anneal or furnace process for activating implanted dopants and annealing implant damage in strained heterojunction devices.

In particular, analysis of phosphorous implants in Si/Ge$_{0.12}$Si$_{0.88}$ strained heterojunction structures shows that a furnace anneal in a temperature range of 400° to 550° C. for 30 minutes is sufficient to reduce most implant related defects while maintaining the strained heterojunction characteristics. However, this temperature range activates less than 20% of the implanted phosphorous. A furnace anneal in a temperature range of 700° to 800° C. for 30 minutes provides sufficient dopant activation but, generates a high density of dislocation defects, particularly at the Si-GeSi interface. These defects produce high leakage currents and cause a relaxation of the strained heterojunction.

According to the present invention, an RTA process meets the requirements for doping strained heterojunction devices. Typically, substrate 16 is annealed at an elevated temperature that is less than approximately 400° C. above the temperature at which strained layer 18 is formed on doped layer 14 in order to avoid relaxation of the strained heterojunction. Preferably, substrate 16 is annealed at a temperature less than approximately 300° C. above the temperature at which strained layer 18 is formed.

For example, when strained layer 18 comprises Si$_{1-x}$Ge$_x$, strained layer 18 typically is formed using molecular beam epitaxial growth at a temperature in a range from 450° to 650° C. Optionally, strained layer 18 is formed using chemical vapor deposition (CVD) at a temperature in a range from 550° to 650° C. Thus, when strained layer 18 comprises Si$_{1-x}$Ge$_x$, substrate 16 is annealed at a temperature less than approximately 850° to 1050° C. depending on the formation conditions of strained layer 18. Preferably, when strained layer 18 comprises Si$_{1-x}$Ge$_x$, substrate 16 is annealed at a temperature less than approximately 750° to 950° C. Typically, substrate 16 is annealed for a time less than 500 seconds, with a time less than 60 seconds preferred.

Preferably, for activating phosphorous implanted regions such as ion implanted region 32 (with a phosphorous implant dose in a range from $8.0 \times 10^{13}$ to $2.0 \times 10^{14}$ ions/cm$^2$ and the implant energy on the order of 180 keV), substrate 16 is exposed to a temperature in a range from 650° to 850° C. for a time less than 60 seconds in an RTA system. Preferably, an RTA system such as an AST SHS200 RTA system is used. Such a system is available from AST Elektronik GMBH, a subsidiary of MRC Corporation with manufacturing facilities in Kirchheim, Germany. Preferably, a non-reactive ambient such as nitrogen is used. These conditions provide good dopant activation, a reduction in implant related damage, and preserve the strained heterojunction characteristics.

An RTA process also is preferred for activating implanted boron, arsenic, and antimony regions in strained heterojunction devices. The exact conditions are dependent upon the implanted species, the implant energy, and the implant dose. The analytical techniques discussed above are suitable for determining such conditions.

Figure 6:
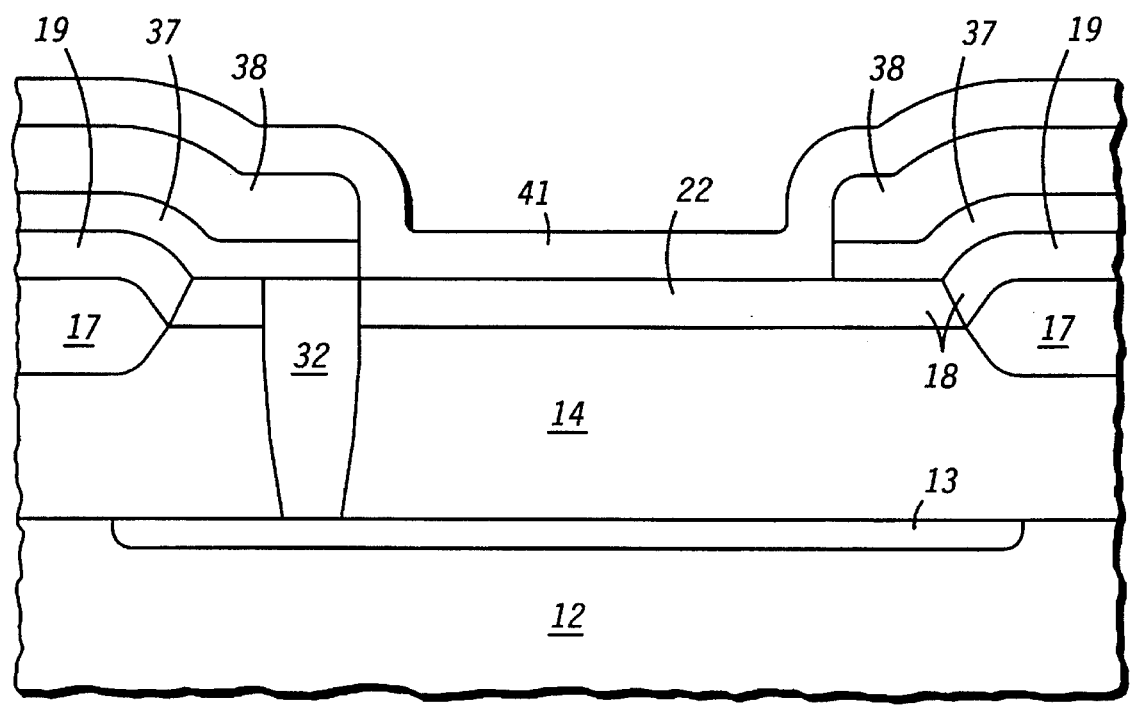

FIG. 6 illustrates strained heterojunction device 11 at a later stage of manufacture. At this point, passivation layers such as dielectric layers 37 and 38 are formed over strained layer 18 and patterned using conventional techniques to provide the structure shown in FIG. 6. For example, dielectric layer 37 comprises a silicon oxide having a thickness on an order of 400 angstroms and dielectric layer 38 comprises a silicon nitride having a thickness on an order of 1,400 angstroms. Dielectric layers 37 and 38 are formed using well known processing techniques.

After dielectric layers 37 and 38 are formed, polycrystalline semiconductor layer 41 is formed over strained monocrystalline semiconductor region 22 and dielectric layer 38. In this example, polycrystalline semiconductor layer 41 is an n-type polycrystalline semiconductor layer. Preferably, polycrystalline semiconductor layer 41 comprises n-type polysilicon and is formed using well known chemical vapor deposition (CVD) techniques. Preferably polycrystalline semiconductor layer 41 has a thickness on an order of 2,000 angstroms and a dopant concentration on an order of $1.0 \times 10^{20}$ atoms/cm$^3$. In this example, polycrystalline semiconductor layer 41 forms an emitter region. During subsequent processing, ohmic layers are placed in contact with polycrystalline semiconductor layer 41, ion implanted region 32, and strained layer 18 to form a completed strained heterojunction bipolar structure or device.

In an optional embodiment, ion implanted region 32 is activated after the formation of polycrystalline semiconductor layer 41. In this optional embodiment, polycrystalline semiconductor layer 41 may be doped with phosphorous using ion implantation. The phosphorous is then activated and annealed in both polycrystalline semiconductor layer 41 and ion implanted region 32 at the same time.

By now it should be appreciated that there has been provided a method for doping strained heterojunction devices. By implanting a strained heterojunction structure while the strained heterojunction structure is maintained at a temperature above room temperature and by activating implanted dopant using a rapid thermal or non-steady state anneal process, implant damage is effectively annealed, implanted dopant is effectively activated, and the strained heterojunction characteristics are maintained.

We claim:

1. A method for doping strained heterojunction semiconductor devices comprising the steps of:

exposing a substrate to a first temperature above room temperature, the substrate including a first layer and a strained mono-crystalline semiconductor layer formed on the first layer, wherein the strained mono-crystalline semiconductor layer forms a strained heterojunction with the first layer;

implanting a dopant into the strained mono-crystalline semiconductor layer while the substrate is exposed to the first temperature; and thereafter exposing the substrate to a second temperature to activate the dopant and to anneal implant damage, wherein the substrate is exposed to the second temperature for a time sufficient to activate the dopant and to anneal the implant damage while maintaining the strained heterojunction in a strained condition.

2. The method of claim 1 wherein the step of exposing the substrate to the first temperature includes exposing a substrate having a silicon layer and a IV-IV mono-crystalline semiconductor alloy layer formed on the silicon layer, wherein the IV-IV mono-crystalline semiconductor alloy layer is formed on the silicon layer at a third temperature, and wherein the step of exposing the substrate to the second temperature includes exposing the substrate to a second temperature that is less than 400° C. above the third temperature for a time less than 500 seconds.

3. The method of claim 1 wherein the step of exposing the substrate to the first temperature includes exposing a substrate having a silicon layer and a $Si_{1-x}Ge_x$ layer formed on the silicon layer, wherein the $Si_{1-x}Ge_x$ layer is formed on the silicon layer at a third temperature, and wherein the step of exposing the substrate to the second temperature includes exposing the substrate to a second temperature that is less than 400° C. above the third temperature for a time less than 500 seconds.

4. The method of claim 3 wherein the step of exposing the substrate to the first temperature includes exposing a substrate having a silicon layer and a $Si_{1-x}Ge_x$ layer formed on the silicon layer, wherein the $Si_{1-x}Ge_x$ layer is formed on the silicon layer at a third temperature, and wherein the step of exposing the substrate to the second temperature includes exposing the substrate to a second temperature that is less than 300° C. above the third temperature for a time less than 60 seconds.

5. The method of claim 1 wherein the step of exposing the substrate to the first temperature includes exposing a substrate having an n-type silicon layer and a p-type $Si_{1-x}Ge_x$ layer formed on the n-type silicon layer, the n-type silicon layer forming a collector region, and the p-type $Si_{1-x}Ge_x$ layer forming a base region, and wherein the step of implanting the dopant includes selectively implanting an n-type dopant into the p-type $Si_{1-x}Ge_x$ layer to form a collector contact region, and wherein the method further includes the step of forming an n-type polycrystalline semiconductor layer on the p-type $Si_{1-x}Ge_x$ layer, the n-type polycrystalline semiconductor layer forming an emitter region.

6. The method of claim 1 wherein the step of implanting the dopant includes ion implanting phosphorous.

7. The method of claim 6 wherein the step of exposing the substrate to the first temperature includes exposing the substrate to a temperature in a range from approximately 40° C. to 300° C.

8. A process for doping a IV-IV strained heterojunction semiconductor device including the steps of:

placing a semiconductor substrate into a ion implanter, the semiconductor substrate including a strained heterojunction structure, heating the semiconductor substrate to a first temperature in a range from approximately 40° C. to 300° C.;

implanting a dopant into the strained heterojunction structure to form an implanted region while the semiconductor substrate is exposed to the first temperature to minimize implantation damage effects; and annealing the semiconductor substrate at a second temperature for a time to activate the dopant and to anneal implant damage while minimizing relaxation of the strained heterojunction structure.

9. The process according to claim 8 wherein the step of placing the semiconductor substrate into the ion implanter includes placing a substrate comprising a silicon layer and a $Si_{1-x}Ge_x$ layer formed on the silicon layer, wherein the $Si_{1-x}Ge_x$ layer forms a strained heterojunction with the silicon layer.

10. The process according to claim 9 wherein the step of placing the semiconductor substrate into the ion implanter includes placing a substrate comprising an n-type silicon layer and a p-type $Si_{1-x}Ge_x$ layer over the n-type silicon layer, the n-type silicon layer forming a collector region and the p-type $Si_{1-x}Ge_x$ layer forming a base region, and wherein the step of implanting the dopant includes selectively implanting phosphorous into the $Si_{1-x}Ge_x$ layer to form a collector contact region, and wherein the process further comprises the step of forming an n-type polysilicon layer over a portion of the $Si_{1-x}Ge_x$ layer, the n-type polysilicon layer forming an emitter region.

11. The process according to claim 10 wherein the step of heating the semiconductor substrate to the first temperature includes exposing the semiconductor substrate to a temperature in a range from approximately 60° C. to 100° C., and wherein the step of implanting phosphorous includes implanting phosphorous at an implant dosage in a range from approximately $8.0 \times 10^{13}$ to $2.0 \times 10^{14}$ ions/cm$^2$.

12. The process according to claim 10 wherein the step of annealing the semiconductor substrate includes annealing the semiconductor substrate in an RTA system at a temperature in a range from 650° C. to 850° C. for less than 60 seconds in a non-reactive ambient.

13. The process according to claim 8 further comprising the step of forming a screen oxide on the semiconductor substrate before the step of implanting the dopant.

14. The process according to claim 8 wherein the step of placing the semiconductor substrate into the ion implanter includes placing a semiconductor substrate comprising a silicon layer and a carbon-doped silicon layer over the silicon layer.

15. The process according to claim 8 wherein the step of placing the semiconductor substrate into the ion implanter includes placing a semiconductor substrate comprising a silicon layer and a germanium/carbon doped silicon layer over the silicon layer.

16. A strained heterojunction bipolar structure having an ion implanted region comprising:

a semiconductor substrate including a first layer having a first conductivity type, a strained mono-crystalline semiconductor layer having a second conductivity type formed on the first layer, wherein the strained mono-crystalline semiconductor layer forms a strained heterojunction with the first layer;

an ion implanted collector contact region of the first conductivity type selectively formed in the strained mono-crystalline semiconductor layer and the first layer such that the strained heterojunction structure is maintained in a strained condition; and a polycrystalline semiconductor layer of the first conductivity type formed on the strained mono-crystalline semiconductor layer, wherein the first layer forms a collector region, the strained mono-crystalline semiconductor layer forms a base region, and the polycrystalline semiconductor layer forms an emitter region.

17. The structure of claim 16 wherein the first layer comprises silicon and the strained mono-crystalline semiconductor layer comprises $Si_{1-x}Ge_x$.

18. The structure of claim 17 wherein X is in a range from 0.01 to 0.50.

19. The structure of claim 17 wherein the polycrystalline semiconductor layer comprises polysilicon.

20. The structure of claim 17 wherein the first conductivity type is n-type and the second conductivity type is p-type, and wherein the strained mono-crystalline semiconductor layer is doped with boron in a range from $1.0 \times 10^{18}$ to $5.0 \times 10^{19}$ atoms/cm$^3$, and wherein the strained mono-crystalline semiconductor layer has a thickness in a range from 0.25 to 0.35 microns, and wherein the first layer is doped with an n-type dopant at a concentration in range from 1.0 to $3.0 \times 10^{16}$ atoms/cm$^3$, and wherein the first layer has a thickness on an order of 1.5 microns.

* * * * *